United States Patent [19]

Shiraishi et al.

[11] Patent Number: 5,401,316
[45] Date of Patent: Mar. 28, 1995

[54] METHOD AND APPARATUS FOR HYDROPHOBIC TREATMENT

[75] Inventors: Masatoshi Shiraishi, Kikuchi; Tomoko Hamada, Kumamoto, both of Japan

[73] Assignees: Tokyo Electron Limited, Tokyo; Tokyo Electron Kyushu Limited, Tosu, both of Japan

[21] Appl. No.: 136,373

[22] Filed: Oct. 15, 1993

[30] Foreign Application Priority Data

Oct. 15, 1992 [JP] Japan .................. 4-302998

[51] Int. Cl.⁶ .................. B05C 11/00; C23C 16/00
[52] U.S. Cl. .................. 118/689; 118/696; 118/719; 118/725; 118/726; 118/728
[58] Field of Search .............. 118/688, 689, 696, 699, 118/725, 726, 719, 728

[56] References Cited

U.S. PATENT DOCUMENTS

| | | | |
|---|---|---|---|
| 4,393,013 | 7/1983 | McMenamin | 118/726 |
| 4,524,126 | 6/1985 | Marinace et al. | 430/311 |
| 4,693,211 | 9/1987 | Ogami et al. | 118/725 |
| 4,870,923 | 10/1989 | Sugimoto | 118/725 |
| 5,091,207 | 2/1992 | Tanaka | 118/725 |
| 5,190,913 | 3/1993 | Higashiyama et al. | 118/689 |

FOREIGN PATENT DOCUMENTS

| | | | |
|---|---|---|---|
| 61-216423 | 9/1986 | Japan | 118/688 |
| 63-141321 | 6/1988 | Japan | 118/688 |
| 63-182816 | 7/1988 | Japan | 118/689 |
| 1-108744 | 4/1989 | Japan | 118/726 |
| 3-18016 | 1/1991 | Japan | 118/689 |
| 3-140471 | 6/1991 | Japan | 118/688 |
| 3-274275 | 12/1991 | Japan | 118/725 |
| 4-43630 | 2/1992 | Japan | 118/689 |
| 4-167432 | 6/1992 | Japan | 118/689 |
| 4-285093 | 10/1992 | Japan | 118/688 |
| 4-357193 | 12/1992 | Japan | 118/689 |
| 5-121306 | 5/1993 | Japan | . |

*Primary Examiner*—W. Gary Jones
*Assistant Examiner*—Steven P. Griffin
*Attorney, Agent, or Firm*—Oblon, Spivak, McClelland, Maier & Neustadt

[57] ABSTRACT

Adhesion apparatus for applying a hydrophobic treatment to a semiconductor wafer comprises a tank housing a treating agent of liquid HMDS and a process chamber into which a mixed gas consisting of a vaporized HMDS coming from the tank and a carrier gas is supplied for applying a hydrophobic treatment to a wafer surface. A supporting table on which the wafer is disposed during the hydrophobic treatment is provided within the process chamber. A heater and a cooling water passageway are housed in the supporting table for controlling the wafer temperature. A concentration measuring section for measuring the HMDS concentration in the waste gas is connected to the discharge pipe of the process chamber. The concentration measuring section is connected to a CPU serving to derive a temperature control signal from the measured value of the HMDS concentration. The temperature control signal is transmitted to a temperature control section. Upon receipt of the temperature control signal, the temperature control section permits controlling the current supply to the heater or the cooling water supply to the cooling water passageway so as to change the temperature of the supporting table.

20 Claims, 5 Drawing Sheets

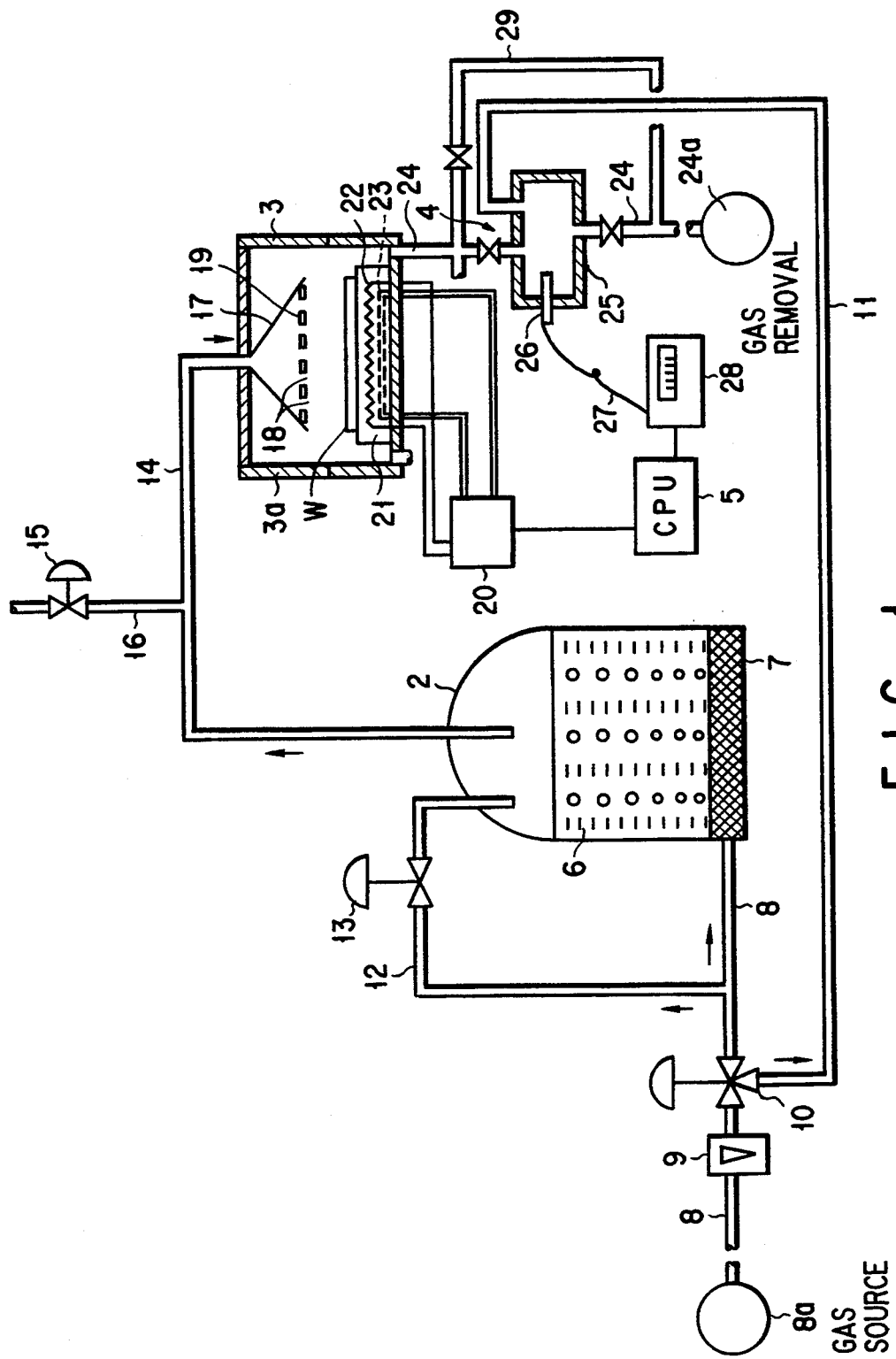
F I G. 1

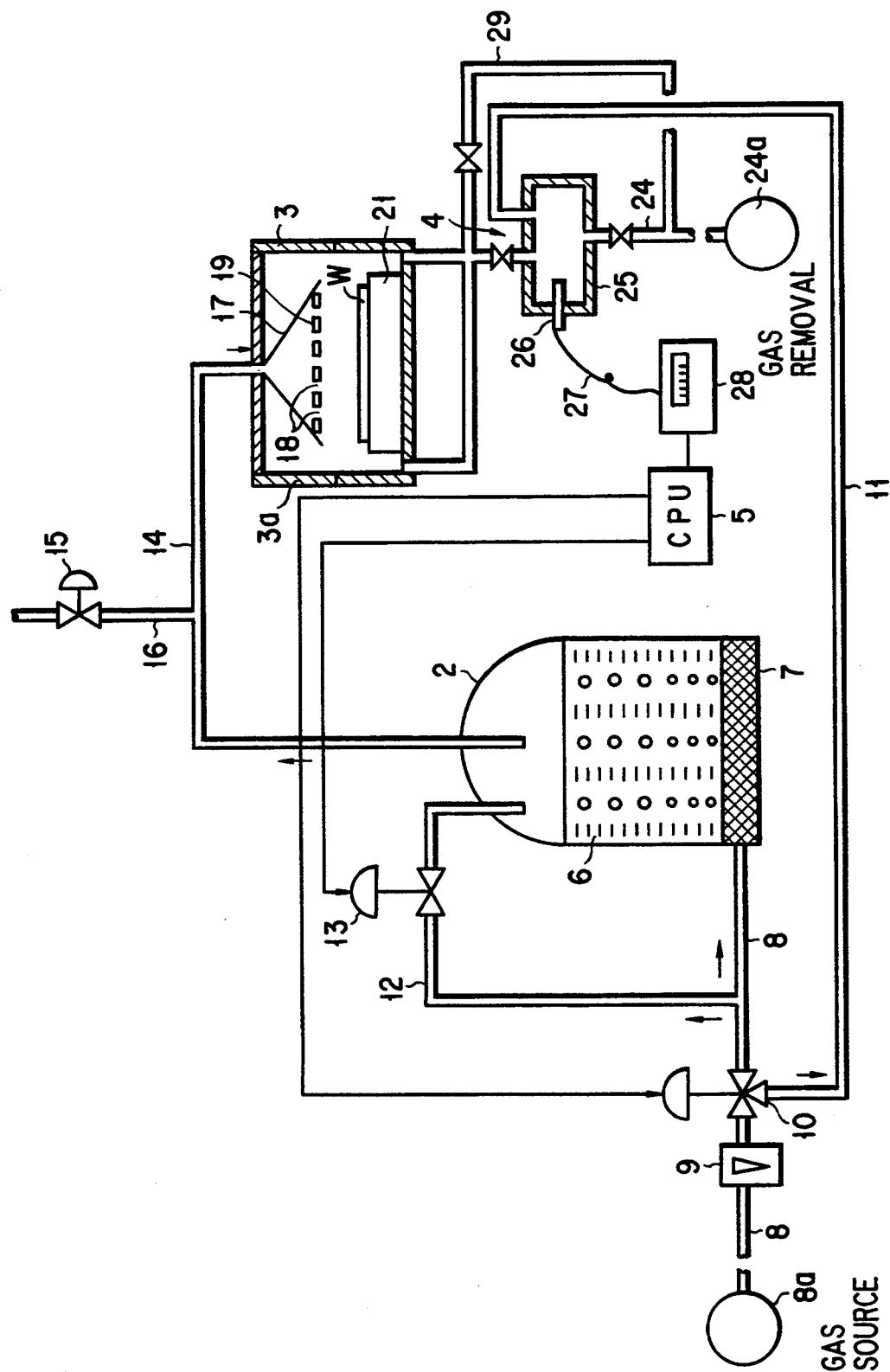
F I G. 2

METHOD AND APPARATUS FOR HYDROPHOBIC TREATMENT

BACKGROUND OF THE INVENTION

1. Field of the Invention

The present invention relates to a method and apparatus for treating the surface of a substrate such as a semiconductor wafer with a vaporized treating agent for making the treated surface hydrophobic.

2. Description of the Related Art

In general, a process of manufacturing a semiconductor device comprises the step of forming a photoresist film on a semiconductor wafer. Before formation of the resist film, the wafer surface contacts with moisture in the atmosphere to form OH groups on the wafer surface, with the result that the wafer surface is rendered hydrophilic. If the hydrophilic surface is coated with a resist, the resist film tends to peel off during the developing process because water penetrates into the interface between the wafer surface and the resist film.

To improve the adhesion strength of the resist film, the wafer surface, before coated with a resist, is exposed to an HMDS gas, i.e., a gaseous compound of hexamethyldisilazane, $[(CH_3)_3SiNHSi(CH_3)_3]$, and the OH groups on the wafer surface are replaced with $Si(CH_3)_3$- groups and, thus, to make the wafer surface hydrophobic. This hydrophobic treatment, which is intended to improve the adhesion strength of the resist film, is also called an adhesion treatment.

In the hydrophobic treatment or adhesion treatment, it is necessary to set the HMDS concentration in a carrier gas at an optimum value for preventing the resist film from being peeled off. To achieve the object, it was customary in the past to employ, for example, a method in which the dilution rate or liquid temperature of HMDS is changed, a method in which the quantity of HMDS is changed, a method in which the flow rate of a vaporizing carrier gas ($N_2$ gas) of HMDS is changed, or a method in which the vaporizing area of HMDS is changed by utilizing a capillary action.

However, in the conventional method in which the dilution rate or liquid temperature of HMDS is changed, it is difficult to maintain a satisfactory condition in the treating section because the control section and the treating section are positioned relatively apart from each other. When it comes to, particularly, the method in which the liquid temperature of HMDS is controlled, the control section is rendered bulky and complex. In addition, the control operation is troublesome. Further, in the conventional methods in which the flow rate of HMDS is changed, in which the flow rate of the $N_2$ gas for vaporizing HMDS is changed, and in which the vaporizing area of HMDS is changed, it is difficult to achieve a subtle control, resulting in failure to prevent sufficiently the resist film from being peeled off.

SUMMARY OF THE INVENTION

An object of the present invention is to provide a method and apparatus for a hydrophobic treatment, which permits controlling easily and accurately the progress of the hydrophobic treatment.

According to a first aspect of the present invention, there is provided a method of treating a surface of a substrate to make the surface hydrophobic, the treatment being carried out within a process chamber having a gas supply pipe and a discharge pipe communicating therewith, comprising the steps of: putting the substrate in the process chamber, followed by closing the process chamber; supplying a mixed gas consisting of a vaporized treating agent and a carrier gas into the process chamber through the gas supply pipe while discharging a waste gas from the process chamber through the discharge pipe; measuring the concentration of the treating agent within the waste gas flowing within the discharge pipe; comparing the measured value of the treating agent concentration with a reference value which is determined on the basis of a predetermined degree of progress of the hydrophobic treatment; and changing at least one of treating conditions of the substrate based on the result of comparison.

According to a second aspect of the present invention, there is provided an apparatus for treating a surface of a substrate to make the surface hydrophobic, comprising: a process chamber; support means for supporting a substrate arranged within the process chamber; temperature adjusting means for adjusting treating temperature of the substrate; a gas supply pipe communicating with the process chamber for supplying a mixed gas consisting of a vaporized treating agent and a carrier gas into the process chamber; a discharge pipe communicating with the process chamber for discharging a waste gas from the process chamber; concentration measuring means connected to the discharge pipe for measuring the concentration of the treating agent within the waste gas flowing within the discharge pipe; and control means for comparing the concentration value measured by the concentration measuring means with a reference value, which is determined on the basis of degree of progress of the hydrophobic treatment, so as to change at least one of treating conditions of the substrate based on the result of comparison.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 schematically shows an apparatus for hydrophobic treatment according to a first embodiment of the present invention;

FIG. 2 schematically shows an apparatus for hydrophobic treatment according to a second embodiment of the present invention;

DETAILED DESCRIPTION OF THE PREFERRED EMBODIMENT

Figure 3:
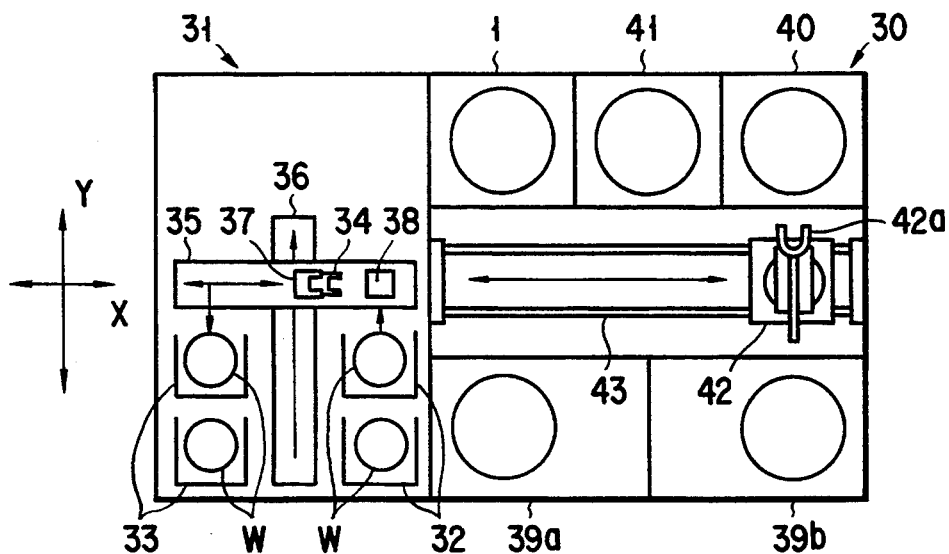
FIG. 3 is a plan view schematically showing a resist coating and developing system including the apparatus shown in FIG. 1 or 2.

The apparatus of the present invention for the hydrophobic treatment or the adhesion treatment is incorporated in a resist coating and developing system shown in, for example, FIG. 3. As shown in the drawing, the system comprises a treating unit 30 for applying various treatments to a wafer W, and a stock unit 31 for stocking the wafers which are introduced into and withdrawn from the treating unit 30.

Two wafer cassettes 32 for stocking the wafers W before the treatment and two wafer cassettes 33 for stocking the wafers W after the treatment are mounted within the stock unit 31. As shown in the drawing, the stock unit 31 comprises an arm 34 for holding the wafer W by suction force. The arm 34 can be moved in a horizontal X-direction, a horizontal Y-direction and a $\theta$ direction (rotation) by moving mechanisms 35, 36 and 37, respectively. A table 38 is provided for the transfer of the wafer W between the treating unit 30 and the stock unit 31.

An apparatus 1 of the present invention for the hydrophobic treatment or adhesion treatment is included in the treating unit 30. In order to improve the adhesion of a resist film to a main surface of the wafer W, the apparatus 1 is used for treating the wafer main surface with a vaporized HMDS before coating with a resist to make the wafer main surface hydrophobic. It is possible to use N-(trimethylsilyl)diethylamine, $(CH_3)_3SiN(C_2H_5)_2$, hereinafter referred to as TMSDEA, in place of HMDS. Of course, a vaporized TMSDEA also permits making the main surface of the wafer W hydrophobic.

The treating unit 30 also comprises coating devices 39a, 39b, a cooling device 40, and a baking device 41. The coating devices 39a, 39b are used for coating the main surface of the wafer W with a resist. The coating device constructed as described in U.S. patent application Ser. No. 07/755,781 filed on Sep. 6, 1991 can be used as these coating devices 39a, 39b, the teachings of the U.S. Patent Application being hereby incorporated by reference. The wafer W before coating with a resist solution is cooled by the cooling device 40 to a predetermined temperature. Further, the resist film formed on the wafer W is heated by the baking device 41 to evaporate the solvent remaining in the resist film.

The treating unit 30 further comprises a transfer device 42 which is movable along a transfer path 43. The transfer device 42 is provided with an arm 42a which serves to transfer the wafer W into and out of each of the apparatus 1 for the hydrophobic treatment or adhesion treatment, coating devices 39a, 39b, cooling device 40 and baking device 41.

In the treating system described above, the wafer W transferred from the stock unit 31 is subjected first to a pretreatment in the apparatus 1 and, then, to cooling, coating and heating treatments in this order. After these treatments, the wafer w is transferred into the stock unit 31 and housed in the cassette 33.

FIG. 1 shows the apparatus 1 of the present invention for the adhesion treatment. As shown in the drawing, the apparatus 1 comprises a tank 2 storing a treating agent of liquid HMDS and a process chamber 3 in which the surface of a substrate, e.g., a semiconductor wafer W, is treated with a vaporized HMDS supplied from the tank 2. A concentration measuring section 4 for measuring the concentration of the treating agent in the waste gas is provided within a line of a waste gas discharged from the process chamber 3. The section 4 is connected to a control section 5 in which a temperature control signal is derived from the measured value of the treating agent concentration.

The tank 2, which stores a treating agent of liquid HMDS 6, is in the form of a cylinder having a bottom and is made of, for example, a quartz glass in order to prevent impurities from eluting into HMDS 6. A bubbler 7 for generating fine bubbles of, for example, a nitrogen gas ($N_2$ gas) is disposed in the bottom portion of the tank 2. The bubbler 7 is made of, for example, a porous material. A nitrogen gas is supplied from a gas source 8a such as a steel gas cylinder into the bubbler 7 through a pipe 8 so as to bring about nitrogen gas bubbles within the tank 2 and, thus, to derive a vapor of HMDS 6.

A float type flow meter 9 and a three-way valve 10, which is electromagnetically operated to permit the nitrogen gas flow to be guided to the bubbler 7, switched or interrupted, are mounted to the pipe 8. A purging gas supply pipe 11 leading to the concentration measuring section 4 is connected to the remaining port of the three-way valve 10. Also, a diluting gas supply pipe 12 is branched from the pipe 8 downstream of the three-way valve 10. A flow control valve 13, which is electromagnetically opened or closed, is mounted midway of the pipe 12, and the tip portion of the pipe 12 is inserted into a head portion of the tank 2.

The head portion of the tank 2 is connected to a head portion of the process chamber 3 via a pipe 14. A nitrogen gas containing the HMDS vapor generated within the tank 2 is supplied into the process chamber 3 via the pipe 14. A pipe 16 provided with a release valve 15 is branched from the pipe 14 for allowing the inner space of the process chamber 3 to communicate with the air atmosphere, if necessary.

The process chamber 3 is in the form of a box and is made of, for example, a quartz glass. A lid 3a is removably mounted to close the upper opening of the process chamber 3. A flared bell mouth 17 downwardly extending within the process chamber 3 is connected to the end portion of the pipe 14. Further, a diffusion plate 19 provided with a large number of diffusion holes 18 is mounted to the lower open portion of the bell mouth 17.

A supporting table 21 for supporting the wafer W under the processing is arranged below the open portion of the bell mouth 17. For controlling the temperature of the wafer w, a heater 22 and a cooling water passageway 23 are provided within the supporting table 21. A power source disposed within a temperature control section 20 is connected to the heater 22, with a cooling water source disposed within the temperature control section 20 being connected to the cooling water passageway 23. The temperature control section 20 serves to control the power supply to the heater 22 or cooling water supply to the cooling water passageway 23 in accordance with a signal generated from a control section 5 so as to control the temperature of the supporting table 21 appropriately. In the embodiment shown in the drawing, the heater 22 and the cooling water passageway 23 are used for the temperature control. Alternatively, the temperature control can be performed by using a Peltier element which generates or absorbs heat depending on the flowing direction of electric current.

A discharge pipe 24 for discharging the waste gas from the process chamber 3 is connected to a bottom portion of the process chamber 3. A pneumatic ejector or a vacuum pump 24a is connected to the discharge pipe 24, making it possible to set up a negative pressure within the process chamber 3. A concentration measuring section 4 for measuring the concentration of the treating agent is mounted to the discharge pipe 24. The measuring section 4 comprises a container 25 made of, for example, a quartz glass. The pipe elements on both the upstream side and downstream side of the discharge pipe 24 are connected to the container 25. Also, a synthetic bimolecular film sensor 26 is housed within the container 25. The concentration of the HMDS vapor contained in the waste gas flowing within the container 25 is measured by the sensor 26. Further, a bypass line 29, which is used when the measuring section 4 is not used, is connected to the discharge pipe 24.

Figure 5:
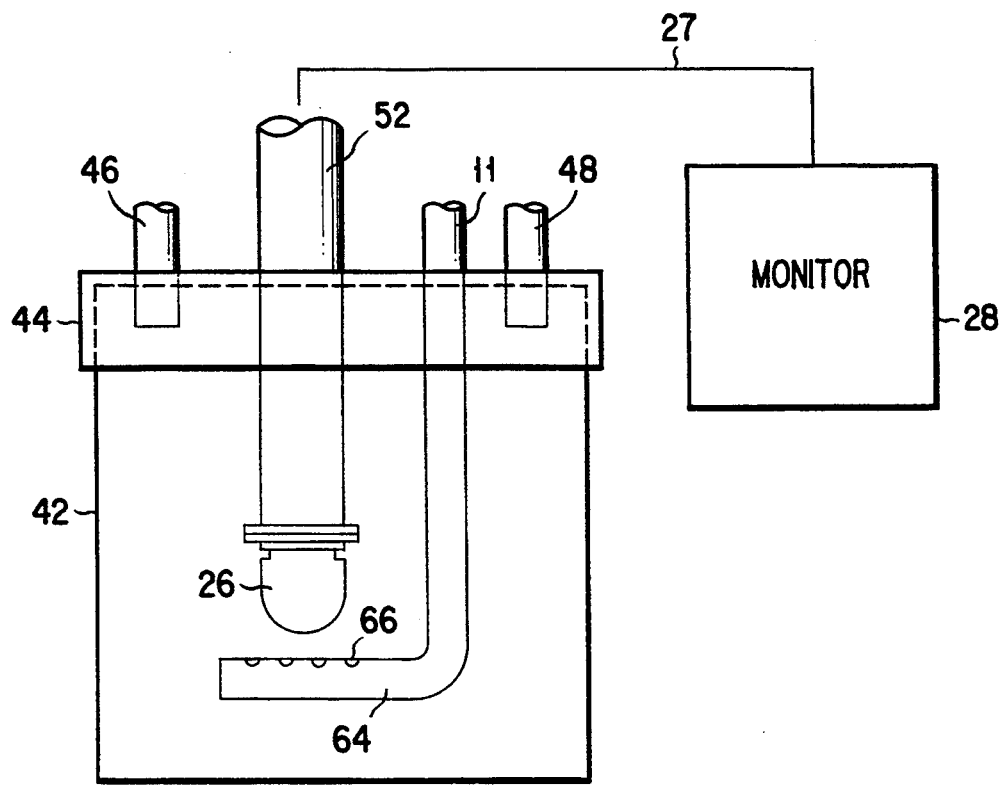
FIG. 5 is a side view schematically showing the inner construction of the concentration measuring section included in the apparatus shown in FIG. 1 or 2.

FIG. 1 shows that the pipe elements on the upstream side and downstream side of the discharge pipe 24 are connected to upper and lower portions of the container 25, respectively. Also, the sensor 26 is mounted to the side portion of the container 24. However, the arrangement shown in FIG. 1 is simply for the sake of convenience in the drawing preparation. In other words, the pipe elements of the discharge pipe 24 and the sensor 26 can be connected to the container 25 in various fashions. FIG. 5 shows an example of such a modification. In this example, the container 25 consists of a container body 42 having an upper opening and a lid 44 removably mounted to close the upper opening of the container body 42. As shown in the drawing, pipe elements 46 and 48 on the upstream side and downstream side, respectively, of the discharge pipe 24 are connected to the container 25 via the lid 44. Further, a supporting pipe 52 of the sensor 26 and the purging pipe 11 extending from the three-way valve 10 are also connected to the container 25 via the lid 44.

Figure 6:
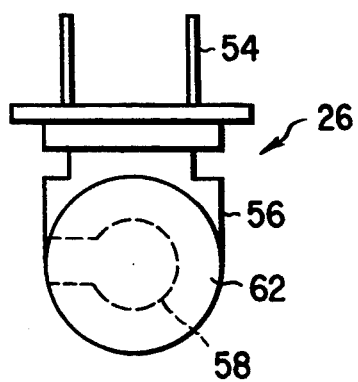
FIG. 6 is a side view showing in a magnified fashion a synthetic bimolecular film sensor.

As shown in FIG. 6, the sensor 26 comprises a plug socket 54 which is detachably mounted to the lower end portion of the supporting pipe 52 for fixing the sensor 26. The sensor 26 is electrically connected to a monitor 28 via the socket 52 and a lead bundle 27 arranged within the supporting plate 52. The sensor 26 also comprises a thin plate-like quartz oscillator 56 and a pair of electrodes 58 mounted on the front and back surfaces of the oscillator 56 for operating the oscillator 56. These electrodes 58 are connected via the lead bundle 27 to an A.C. power source housed in the monitor 28.

The surfaces of the quartz oscillator 56 and the electrodes 58 are covered with a synthetic bimolecular film 62. The synthetic bimolecular film 62 has a structure very close to that of a lipid bimolecular film used for adsorption of odor-generating substances. If HMDS molecules are adsorbed on the synthetic bimolecular film 62, the natural oscillation of the quartz oscillator 56, i.e., the oscillation frequency (vibrating rate) of the oscillator is changed, because a constant of an electrical equivalent circuit to the quartz oscillator 56 is changed depending on the adsorbed amount of the HMDS molecules. The oscillation frequency of the oscillator 56 is detected by the monitor 28. If, for example, the adsorption amount is increased, the oscillation frequency is lowered. It follows that it is possible to measure the concentration of the vaporized HMDS molecules by detecting the oscillation frequency. The synthetic bimolecular film sensor 26 of the particular construction is known to the art as a fragrance sensor, which is available on the market as, for example, "Fragrance Sensor SF-105 Series" manufactured by Sogo Pharmaceutical Co., Ltd.

The measured value of the HMDS vapor concentration is calculated by, for example, a CPU 5 acting as a control section. The calculated value is compared with a predetermined reference value, and a temperature controlling electric signal is transmitted on the basis of the comparison from the CPU 5 to the temperature control section 20. Upon receipt of the electric signal, the temperature control section 20 permits controlling the power supply to the heater 22 or the cooling water supply to the cooling water passageway 23 so as to control the temperature of the supporting table 21 appropriately.

The surface of the synthetic bimolecular film 62 included in the sensor 26 is saturated with HMDS molecules if the HMDS vapor is adsorbed on the film surface to some extent. To maintain a satisfactory measuring sensitivity, it is necessary to remove the adsorbed HMDS molecules from the surface of the film 62 at a reasonable interval. For removing the adsorbed HMDS molecules, the purging gas supply pipe 11 is connected to the container 25. To be more specific, an inert gas, such as nitrogen, as a purging gas is supplied through the pipe 11 into the container 25, when required, so as to remove the adsorbed HMDS molecules from the surface of the film 62.

In general, the sensor 26 is not satisfactory in its heat resistance, making it undesirable to mount the sensor 26 within the process chamber 3 if the treating temperature within the chamber 3 reaches as high as 60° C. Also, it may be possible to mount the sensor 26 to the pipe 14 upstream of the process chamber 3. In this case, however, a purging nitrogen gas tends to enter the process chamber 3. Thus, it is desirable to mount the sensor 26 to the discharge pipe 24.

The apparatus of the present invention for the adhesion treatment is operated as follows. In the first step, the lid 3a of the process chamber 3 is opened to put the wafer W transferred from the previous step on the supporting table 21, followed by hermetically closing the lid 3a. Then, the process chamber 3 is evacuated to reduce the inner pressure of the chamber 3. When the inner pressure of the process chamber 3 is lowered to reach a predetermined vacuum state, a nitrogen gas is introduced through the pipe 8 into the bubbler 7 and, then, into the tank 2. At the same time, a predetermined amount of a nitrogen gas is introduced through the pipe 12 into the upper portion of the tank 2. As a result, the liquid HMDS 6 is vaporized by the nitrogen gas bubbles generated from the bubbler 7. The resultant HMDS vapor is derived from the liquid phase within the tank 2 together with the nitrogen gas into the gaseous phase in the upper region of the tank 2. The HMDS vapor present in the gaseous phase is diluted with a nitrogen gas supplied through the pipe 12 and, then, introduced into the process chamber 3 through the pipe 14. The diluted HMDS vapor supplied through the pipe 14 flows through the bell mouth 17 so as to be uniformly sprayed onto the wafer w through the diffusion holes 18 of the diffusion plate 19. In this fashion, a hydrophobic treatment or adhesion treatment is kept applied for a predetermined period of time to the main surface of the wafer w. The hydrophobic treatment thus applied permits improving the adhesion strength of a photoresist to the wafer surface in the subsequent photoresist coating step.

Figure 8:
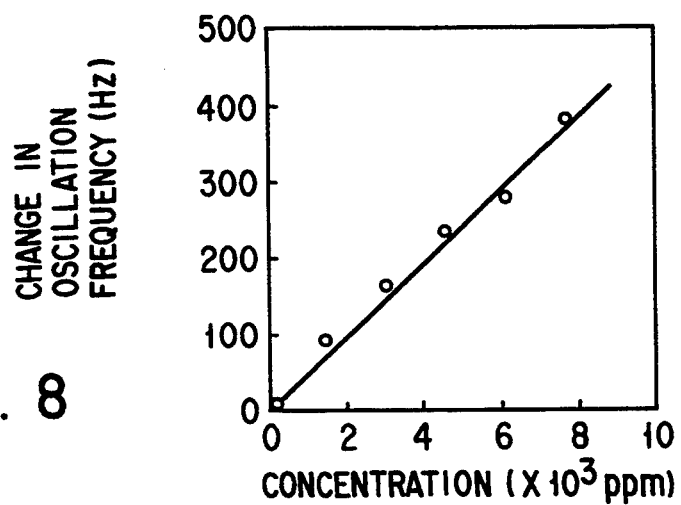
FIG. 8 is a graph showing the relationship between the HMDS concentration and the change in the vibrating frequency of the synthetic bimolecular film sensor.

The gas used in the hydrophobic treatment is discharged as a waste gas from the process chamber 3 through the discharge pipe 24. The discharged waste gas passes through the container 25 in the concentration measuring section 4. In this step, the HMDS concentration in the waste gas is measured indirectly by the synthetic bimolecular film sensor 26 as an oscillating frequency of the quartz oscillator. The relationship between the oscillation frequency of the quartz oscillator and the HMDS concentration can be experimentally determined in advance. Specifically, FIG. 8 shows the relationship between the HMDS concentration and the change in the oscillation frequency of the synthetic bimolecular film sensor 26, said relationship being determined experimentally. As seen from FIG. 8, the HMDS concentration is substantially proportional to the change in the oscillation frequency, making it possible to obtain substantially accurately the measured value of the HMDS concentration based on the change in the oscillation frequency.

The measured value of the HMDS concentration is supplied to the CPU 5 through the monitor 28 for comparison with a predetermined reference value. Based on the result of the comparison, the CPU 5 controls the temperature control section 20 so as to control the temperature of the supporting table 21 at a desired treating temperature. For example, the temperature of the supporting table 21 is maintained at a suitable level or is changed to conform with the change in the HMDS concentration within a range of between, for example, 50° C. and 150° C. Under this condition, the surface of the wafer W put on the supporting table 21 is uniformly treated so as to be made hydrophobic.

Figure 7:
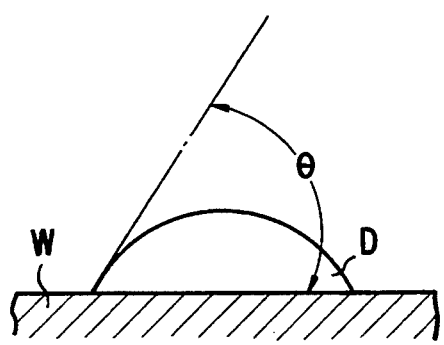
FIG. 7 shows the state that a water droplet is formed on a wafer for evaluation of the hydrophobic treatment.
Figure 9:
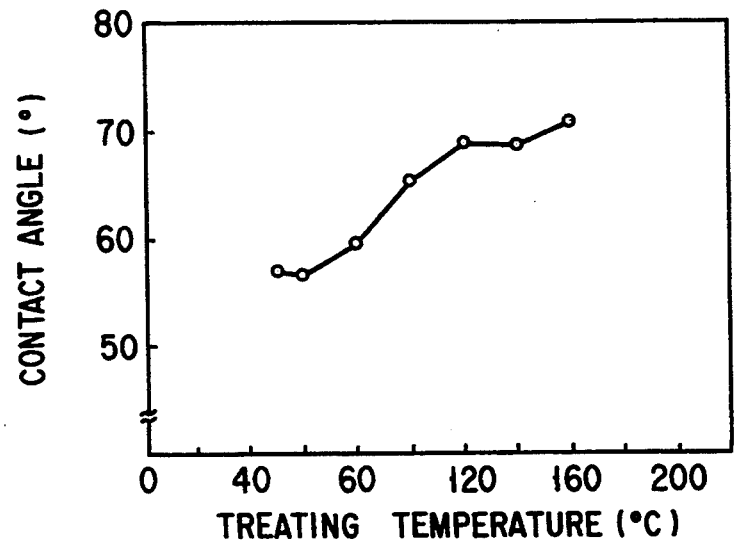
FIG. 9 is a graph showing the relationship between the treating temperature and the contact angle of a water droplet formed on a wafer, said contact angle providing a basis for the evaluation of the hydrophobic treatment.

The contact angle of a water droplet formed on the wafer W with the wafer surface is used as a criterion for evaluating the hydrophobic treatment. FIG. 9 shows the relationship, which has been experimentally obtained, between the treating temperature of the wafer W and the contact angle of the water droplet noted above, i.e., an angle $\theta$ shown in FIG. 7, which is formed between the peripheral portion of a water droplet formed on the wafer W and the wafer surface. The experimental data shown in FIG. 9 covers the case where the HMDS concentration is set constant. The surface of the wafer W is made hydrophobic by the hydrophobic treatment or adhesion treatment. In other words, the contact angle $\theta$ noted above is increased with progress of the hydrophobic treatment.

FIG. 9 shows that the hydrophobic treatment is promoted with increase in the treating temperature. In other words, where the HMDS concentration measured in the concentration measuring section 4 is lower than a predetermined reference value, the hydrophobic treatment can be promoted by elevating the treating temperature. Likewise, where the measured concentration is higher than a predetermined reference value, the hydrophobic treatment can be suppressed by lowering the treating temperature.

After the hydrophobic treatment, the supply of the nitrogen gas and the HMDS vapor to the process chamber 3 is stopped. However, the discharge operation is continued so as to discharge the harmful gas remaining in the chamber 3 to the outside to some extent. Then, the release valve 15 arranged on the pipe 16 is opened so as to bring the inner pressure of the process chamber 3 back to the atmospheric pressure. Further, the treated wafer W is exchanged with a new wafer which is to be treated, and the treatments described above are repeatedly applied to the new wafer.

In exchanging the wafers, it is necessary in some cases to remove HMDS molecules adsorbed on the surface of the film 62 of the sensor 26 in order to maintain a satisfactory sensitivity of the sensor 26. In such a case, the three-way valve arranged on the pipe 8 is switched to permit a nitrogen gas to be introduced into the container 25 via the pipe 11. The HMDS vapor within the container 25 is purged and replaced by the nitrogen gas. At the same time, the HMDS molecules adhered to the surface of the film 62 are removed.

The purging operation is performed in view of the actual treating process, e.g., in treating every wafer, every predetermined number of wafers, at the beginning or end of treating a lot of the wafers. Where the container 25 in the concentration measuring section 4 is purged with a nitrogen gas every time a plurality of wafers are treated, the amount of HMDS molecules adsorbed on the sensor 26 is gradually increased. However, the change in the oscillation frequency of the oscillator 56 included in the sensor 26 is proportional to the HMDS concentration, as shown in FIG. 8, making it possible to measure the concentration based on the change in the oscillation frequency with a reasonable accuracy. In other words, the measured value in the monitor 28 need not be reset every time a single wafer is treated.

As shown in FIG. 5, the pipe 11 comprises a horizontal portion 64 positioned below the sensor 26 and extending within the container 25. The horizontal portion 64 is provided with a plurality of holes 66 positioned to face the sensor 26. A nitrogen gas is spurted from the holes 66 toward the sensor 26 so as to remove efficiently the HMDS molecules attached to the surface of the film 62.

After the purging operation, a new wafer is transferred into the process chamber 3, followed by switching the three-way valve 10 so as to supply a nitrogen gas into the tank 2. Further, the operations described above are repeated so as to apply the hydrophobic treatment or adhesion treatment to the surface of the new wafer.

FIG. 2 shows an apparatus according to a second embodiment of the present invention for applying a hydrophobic treatment or adhesion treatment to the surface of a substrate. The reference numerals commonly put in FIGS. 1 and 2 denote the same members of the apparatus and, thus, the description thereof is omitted. In the apparatus of the second embodiment, the flow rate of the diluting nitrogen gas can be controlled on the basis of the measured value obtained in the concentration measuring section 4. Further, the treating time in the process chamber 3 can be controlled appropriately. The characteristic parts of the apparatus shown in FIG. 2 can be used in combination with the apparatus shown in FIG. 1.

In the apparatus shown in FIG. 2, the mixing ratio of the HMDS vapor to the carrier gas, i.e., the HMDS concentration in the mixed gas on the inlet side of the process chamber 3, can be controlled directly by controlling the flow rate of the diluting nitrogen gas supplied into the tank 2 via the pipe 12. This is effective for controlling the progress of the hydrophobic treatment. In the second embodiment, the control section (or CPU 5) is connected to the flow control valve 13, which is electromagnetically operated, so as to control the degree of opening of the valve 13. To be more specific, the measured value of the HMDS concentration obtained in the measuring section 4 is supplied to the CPU 5 through the monitor 28 and, then, compared with a predetermined reference value in the CPU 5. The opening degree of the flow control valve 13 is controlled on the basis of the comparison performed in the CPU 5. As a result, the flow rate of the diluting nitrogen gas is increased or decreased so as to maintain the HMDS concentration in the mixed gas supplied to the process chamber 3 at a set value.

Figure 10:
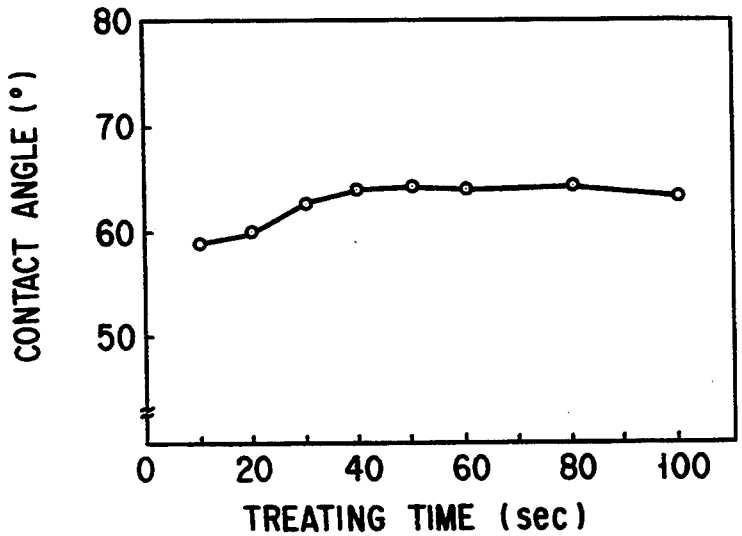
FIG. 10 is a graph showing the relationship between the treating time and the contact angle of a water droplet formed on a wafer.

In the second embodiment, it is also possible to control the treating time. FIG. 10 shows the relationship, which has been experimentally obtained, between the treating time of the wafer W and the contact angle of the water droplet formed on the surface of the wafer W. The experiment was conducted under the condition that the HMDS concentration was set constant. As described previously, the contact angle of the water droplet provides a criterion for evaluating the hydrophobic treatment. As seen from FIG. 10, the progress of the hydrophobic treatment is affected by the treating time where the treating time is not longer than, particularly, 50 seconds. In other words, if the HMDS concentration measured in the concentration measuring section 4 is lower than the predetermined value, the degree of the hydrophobic treatment can be adjusted appropriately by increasing the treating time. Likewise, if the HMDS concentration measured in the section 4 is higher than the predetermined value, the degree of the hydrophobic treatment can be controlled appropriately by decreasing the treating time.

In the second embodiment shown in FIG. 2, the CPU 5 is also connected to the three-way valve 10, which is electromagnetically operated, for switching the valve 10. To be more specific, the measured value of the HMDS concentration obtained in the measuring section 4 is supplied to the CPU 5 via the monitor 28 for comparison with a predetermined reference value in the CPU 5. Based on the result of the comparison, the open time of each of the three-way valve 10 and the flow rate control valve 13 is controlled. If the valves 10 and 13 are closed, the mixed gas consisting of the HMDS vapor and the carrier gas ceases to be supplied to the process chamber 3, making it possible to control the treating time. It follows that the insufficient or excessive progress of the hydrophobic treatment, which is caused by the deviation from the set value of the HMDS concentration, can be corrected by controlling the treating time.

Figure 4:
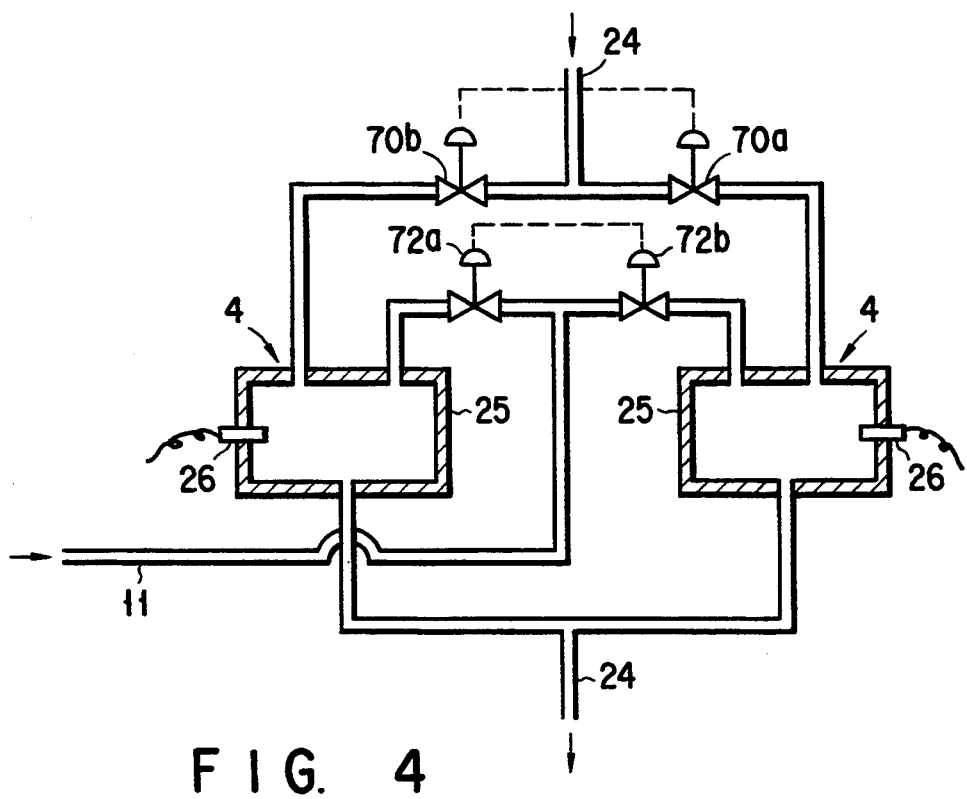
FIG. 4 shows a modification which includes two concentration measuring sections.

FIG. 4 shows a modification in which two concentration measuring sections 4 are provided in the apparatus shown in FIG. 1 or 2. In this modification, the discharge pipe 24 connected to the process chamber 3 is branched into two pipes, and the two concentration measuring sections 4 are connected to these two branched pipes, respectively. The purging gas supply pipe 11 is also branched into two pipes and connected respectively to two containers 25 included in the measuring sections 4. Valves 70a and 70b, which are electromagnetically operated, are respectively arranged on the two branches of the discharge pipe 24 upstream of the containers 25. Further, valves 72a, 72b, which are electromagnetically operated, are respectively arranged on the two branches of the purging gas pipe 11. The modification shown in FIG. 4 permits measuring the HMDS concentration in one of the two concentration measuring sections while the other concentration measuring section is being purged in preparation for the next measurement of the HMDS concentration, leading to an improved treating efficiency of the apparatus.

In a manner of setting the apparatus shown in each of FIGS. 1 and 2, the tank 4 has an inner volume of, for example, about 5 liters, and about 2 to 3 liters of liquid HMDS 6 is housed in the tank 4. During the hydrophobic treatment or adhesion treatment, a nitrogen gas is supplied in a flow rate of about 7 l/min under a pressure of 0.5 kg/cm$^2$. The wafer is heated to a temperature falling within a range of between 50° and 150° C., e.g., to 60° C. Under this condition, the wafer is subjected to a hydrophobic treatment for about 20 to 80 seconds, e.g., 45 seconds. The process chamber 3 is evacuated for about 5 seconds before the hydrophobic treatment. After the hydrophobic treatment, the chamber 3 is evacuated for about 7 seconds for releasing the remaining gas from the chamber 3. For purging the container 25 included in the concentration measuring section 4, a nitrogen gas is supplied in a flow rate of, for example, 3 l/min., which is lower than in the normal operation, though the nitrogen gas flow rate also depends on the purging time.

The conditions of the hydrophobic treatment can be adjusted based on the measured value of the HMDS concentration for every wafer or for a plurality of wafers. Where the measuring section 4 is not used, the by-path line 29 is used. It is possible to use a metal or ceramic oscillator in place of the quartz oscillator used in the embodiments described above. In the embodiments described above, the sensor included in the concentration measuring section 4 comprises an oscillator whose oscillation frequency is changed by the adsorption of HMDS molecules on the sensor. Alternatively, it is possible to use a sensor whose characteristics such as the electrical resistance, electrostatic capacitance, inductance, color or light reflectance are changed depending on the adsorption of HMDS molecules. It is also possible to omit the concentration measuring section 4. In this case, the relationship among the nitrogen gas supply rate, the treating temperature, and the amount of the liquid HMDS housed in the tank 2 is determined in advance so as to obtain the HMDS concentration from the particular relationship.

In each of the embodiments described above, HMDS is used as a treating agent. Alternatively, TMSDEA referred to previously can be used in place of HMDS. Also, a semiconductor wafer is used as a substrate to be treated in each of the embodiments described above. However, the apparatus of the present invention can also be used for applying the hydrophobic treatment to other substrates such as s glass substrate, CD or LCD substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for treating a surface of a substrate to make said surface hydrophobic comprising:
   a process chamber;
   support means for supporting a substrate, arranged within said process chamber;
   temperature adjusting means for adjusting treatment temperature of said substrate;
   a gas supply pipe communicating with said process chamber for supplying a mixed gas consisting of a vaporized treating agent and a carrier gas into said process chamber;
   a discharge pipe communicating with said process chamber for discharging a waste gas from said process chamber;
   concentration measuring means connected to said discharge pipe for measuring a concentration of said treating agent within said waste gas flowing within said discharge pipe; and
   control means for comparing the concentration value measured by said concentration measuring means with a reference value, which is determined on a basis of degree of progress of the hydrophobic treatment, so as to change at least one of treatment conditions of said substrate based on the result of comparison,
   wherein said concentration measuring means comprises a synthetic bimolecular film sensor including an oscillator and a synthetic bimolecular film covering said oscillator, the oscillation frequency of said oscillator being changed depending on the amount of said treating agent absorbed on said synthetic bimolecular film so as to measure the concentration of said treating agent within said waste gas,
   wherein said concentration measuring means comprises a container housing said sensor and connected to said discharge pipe, and
   wherein a purging pipe is connected to said container for purging said container with a gas having a composition substantially the same as that of said carrier gas.

2. The apparatus according to claim 1, wherein said support means comprises a supporting table on which said substrate is disposed, said supporting table being arranged within said process chamber and housing said temperature adjusting means.

3. The apparatus according to claim 2, wherein said temperature adjusting means comprises a heater and a cooling water passageway arranged in said supporting table.

4. The apparatus according to claim 2, wherein said one of said treatment conditions comprises said treatment temperature, and wherein said temperature adjusting means is connected to and controlled by said control means, and said control means causes said temperature adjusting means to elevate said treatment temperature when the measured value of the treating agent concentration is lower than said reference value and to lower said treatment temperature when the measured value of the treating agent concentration is higher than said reference value.

5. The apparatus according to claim 2, wherein said one of said treatment conditions comprises treatment time, and wherein said control means causes said treatment time to be increased when the measured value of the treating agent concentration is lower than said reference value and to be decreased when the measured value of the treating agent concentration is higher than said reference value, 6. The apparatus according to claim 5, wherein said control means controls said treatment time by stopping the supply of said mixed gas into said process chamber.

7. The apparatus according to claim 2, further comprising a tank containing said treating agent in a liquid state, and first and second tubing for introducing said carrier gas into said gas supply pipe, wherein said first tubing is connected to said tank for causing a first part of said carrier gas to pass through said treating agent as bubbles and to induce said vaporized treating agent, and said second tubing is arranged for causing that a second part of said carrier gas be mixed with said first part of said carrier gas which has passed through said treating agent before said carrier gas is introduced into said gas supply pipe.

8. The apparatus according to claim 7, further comprising a flow rate control valve arranged on said second tubing and connected to,said control means, said control means enabling said flow rate control valve to control a flow rate of said second part of said carrier gas through said second tubing so as to Change the concentration of said treating agent within said mixed gas.

9. The apparatus according to claim 1, wherein said treating agent comprises hexamethyldisilazane.

10. The apparatus according to claim 1, wherein said carrier gas comprises nitrogen.

11. An apparatus for treating a surface of a substrate to make said surface hydrophobic, comprising:
   a process chamber;
   support means for supporting a substrate, arranged within said process chamber;
   temperature adjusting means for adjusting treatment temperature of said substrate;
   a gas supply pipe communicating with said process chamber for supplying a mixed gas consisting of a vaporized treating agent and a carrier gas into said process chamber;
   a discharge pipe communicating with said process chamber for discharging a waste gas from said process chamber;
   concentration measuring means connected to said discharge pipe for measuring a concentration of said treating agent within said waste gas flowing within said discharge pipe; and
   control means for comparing the concentration value measured by said concentration measuring means with a reference value, which is determined on the basis of degree of progress of the hydrophobic treatment, so as to change at least one of treatment conditions of said substrate based on the result of comparison,
   wherein said concentration measuring means comprises a sensor which measures the concentration of said treating agent within said waste gas, depending on the amount of said treating agent absorbed by said sensor,
   wherein said concentration measuring means comprises a container housing said sensor and connected to said discharge pipe, and
   wherein a purging pipe is connected to said container for introducing an inert gas and purging said container.

12. The apparatus according to claim 11, wherein said support means comprises a supporting table on which said substrate is disposed, said supporting table being arranged within said process chamber and housing said temperature adjusting means.

13. The apparatus according to claim 12, wherein said inert gas is a gas having a composition substantially the same as that of said carrier gas.

14. The apparatus according to claim 13, wherein said sensor comprises a synthetic bimolecular film sensor including an oscillator and a synthetic bimolecular film covering said oscillator, the oscillation frequency of said oscillator being changed depending on the amount of said treating agent absorbed on said synthetic bimolecular film so as to measure the concentration of said treating agent within said waste gas.

15. The apparatus according to claim 11, wherein said one of said treatment conditions comprises said treatment temperature, and wherein said temperature adjusting means is connected to and controlled by said control means, and said control means causes said temperature adjusting means to elevate said treatment temperature when the measured value of the treating agent concentration is lower than said reference value and to lower said treatment temperature when the measured value of the treating agent concentration is higher than said reference value.

16. The apparatus according to claim 11, wherein said one of said treatment conditions comprises treatment time, and wherein said control means causes said treatment time to be increased when the measured value of the treating agent concentration is lower than said reference value and to be decreased when the measured value of the treating agent concentration is higher than said reference value.

17. The apparatus according to claim 16, wherein said control means controls said treatment time by stopping the supply of said mixed gas into said process chamber.

18. The apparatus according to claim 11, further comprising a tank containing said treating agent in a liquid state, and first and second tubing for introducing said carrier gas into said gas supply pipe, wherein said first tubing is connected to said tank for causing a first part of said carrier gas to pass through said treating agent as bubbles and to induce said vaporized treating agent, and said second tubing is arranged for causing that a second of said carrier gas be mixed with said first part of said carrier gas which has passed through said treating agent before said carrier gas is introduced into said gas supply pipe.

19. The apparatus according to claim 18, further comprising a flow rate control valve arranged on said second tubing and connected to said control means, said control means enabling said flow rate control valve to control a flow rate of said second part of said carrier gas through said second tubing so as to change the concentration of said treating agent within said mixed gas.

20. The apparatus according to claim 11, wherein said treating agent comprises hexamethyldisilazane.

* * * * *